(12) United States Patent
Uekubo et al.

(10) Patent No.: US 6,198,657 B1
(45) Date of Patent: Mar. 6, 2001

(54) NONVOLATILE SEMICONDUCTOR MEMORY DEVICE AND METHOD OF MANUFACTURING THE SAME

(75) Inventors: Masaki Uekubo, Tokyo; Shogo Miike, Kawasaki, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/524,560

(22) Filed: Mar. 13, 2000

(30) Foreign Application Priority Data

Mar. 15, 1999 (JP) .................................................. 11-069310

(51) Int. Cl.⁷ .................................................. G11C 16/07
(52) U.S. Cl. ................................ 365/185.04; 365/185.29; 365/195
(58) Field of Search ..................... 365/185.04, 185.29, 365/195

(56) References Cited

U.S. PATENT DOCUMENTS

| | | | |
|---|---|---|---|
| 4,439,804 | * 3/1984 | Riddle et al. | 365/195 |
| 5,673,222 | * 9/1997 | Fukumoto et al. | 365/185.04 |
| 5,917,750 | * 6/1999 | Miyakawa et al. | 365/185.04 |
| 6,000,004 | * 12/1999 | Fukumoto | 365/185.04 |
| 6,088,262 | * 7/2000 | Nasu | 365/185.04 |
| 6,108,235 | * 8/2000 | Honma | 365/185.04 |

* cited by examiner

*Primary Examiner*—Tan T. Nguyen
(74) *Attorney, Agent, or Firm*—Young & Thompson

(57) ABSTRACT

A nonvolatile memory device is provided capable of shipping after setting it as a flash memory or as a one-time memory, and which cannot be altered to a flash memory once it has been used as a one-time memory. The nonvolatile memory device of the present invention has a circuit structure such that when a nonvolatile memory receives an instruction of prohibiting erasure of internal data, the instruction is stored by setting a prescribed flag provided in the nonvolatile memory at a predetermined value, and the content of the present nonvolatile memory cannot be erased after packaging, so that it is impossible for a user to alter the values of the flag which indicates whether erasure of data is prohibited or permitted.

14 Claims, 10 Drawing Sheets

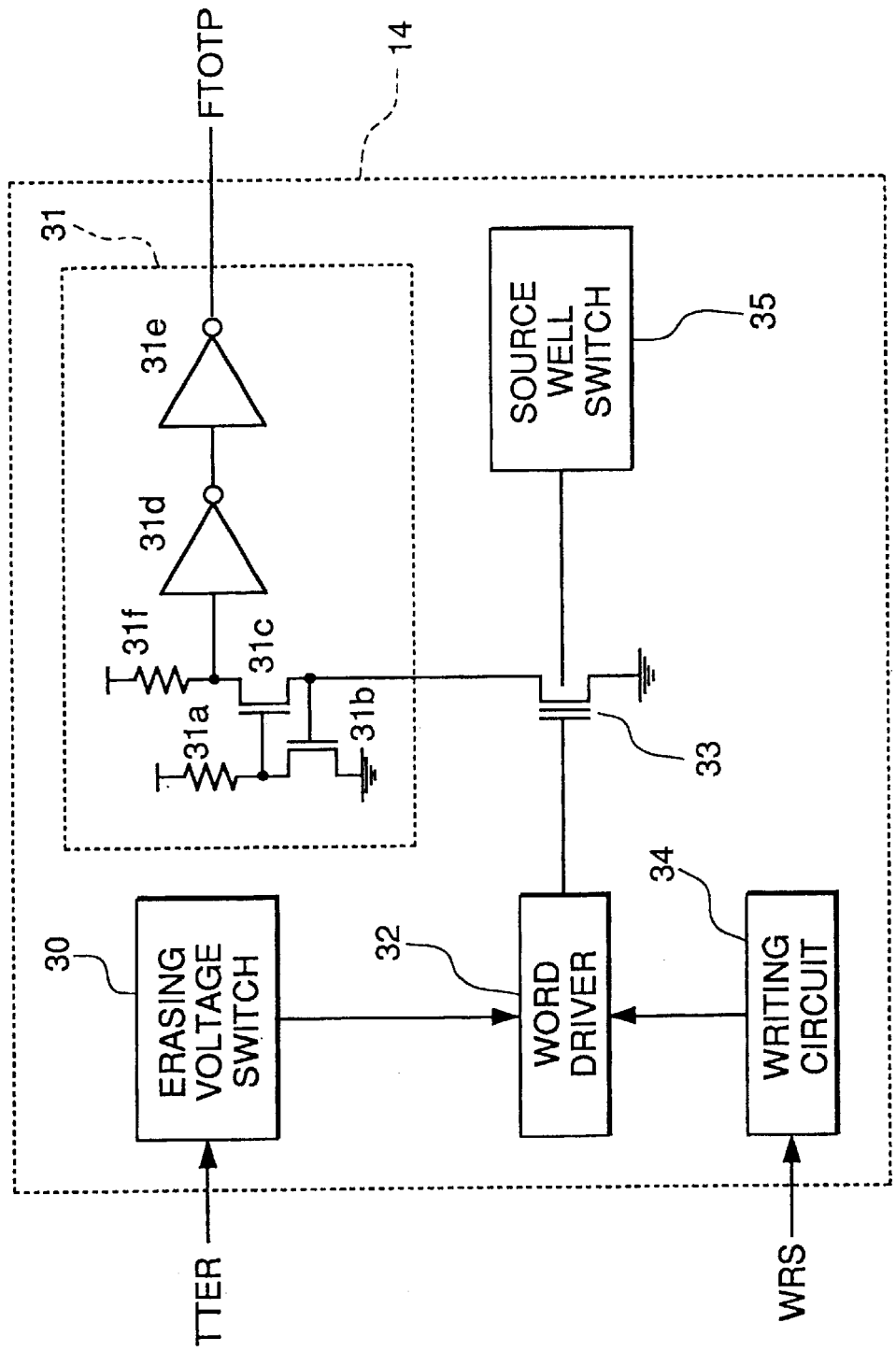

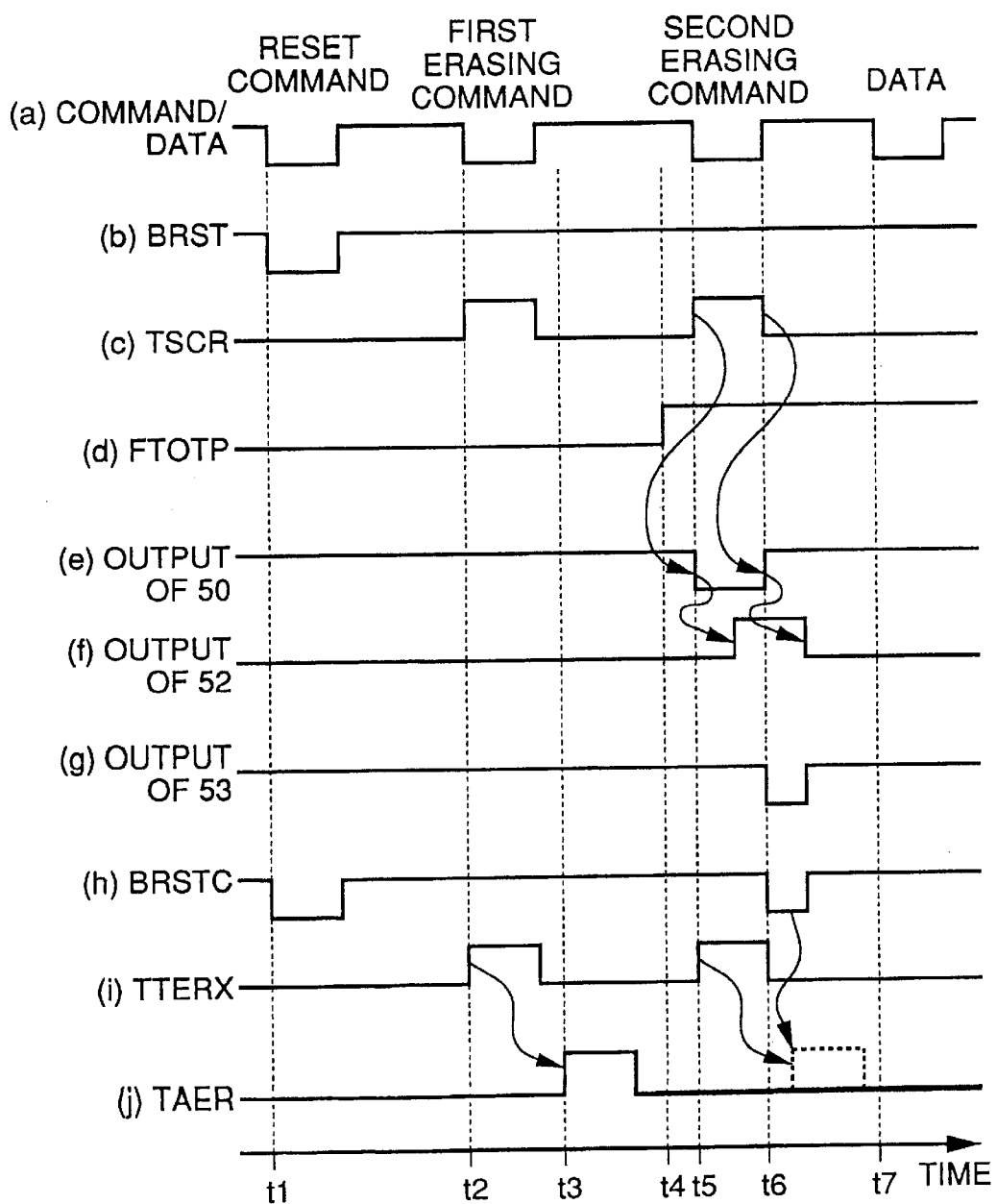

NONVOLATILE SEMICONDUCTOR MEMORY DEVICE AND METHOD OF MANUFACTURING THE SAME

BACKGROUND OF THE INVENTION

1. Field of the Invention

The present invention relates to a nonvolatile semiconductor memory device, and method of manufacturing the same, which can be set so that the user cannot change or reset the writing prohibition state, once the user has set the writing prohibition state.

2. Background Art

Nonvolatile semiconductor memory devices such as EPROMs (Electrically Erasable and Programable Read Only Memory) are memories which are electrically rewritable. Since stored information in those nonvolatile semiconductor memory devices does not disappear even if the electric power supply is turned off, those memory devices are widely used as external storage devices.

Those nonvolatile memory devices are manufactured as wafers and after cutting into chips, the separated nonvolatile memory devices are packaged for supplying to primary users. The primary user writes various types of programs and information into individual memory devices, which are then built into electronic equipment for final users.

For example, in mobile phones, a primary user writes in the nonvolatile memories a program for inputting using the number buttons, a program for sounding a mail arrival sound, and an identification number for sales to a final user. The final user can register a list of phone numbers in the nonvolatile memory. However, if the final user can rewrite the identification number with malicious intent, the final user will be able to use the phone by impersonating another final user free of charge.

In a game machine, a primary user writes in the nonvolatile memory a game program and sells the nonvolatile memory to the final user after setting it into a cartridge. The final user can enjoy the game by just inserting the cartridge into a slot of the game machine and can enjoy another game by changing the cartridge. The primary user could produce the cartridge by writing a program in a mask ROM. However, in order to produce the mask ROM, since it is necessary for a primary user to make a mask ROM for each program which is produced by the primary user, the mask ROM becomes high cost, and the manufacture of the mask ROM requires time consuming processes. In addition, if the program contains a bug, the program cannot be amended unless the mask ROM is re-produced. At the beginning of development, the above-described reasons makes the primary user utilize nonvolatile memory instead of a mask memory for reducing the period for development and for facilitating the correction of bugs.

When the nonvolatile memory is used as the cartridge of a game machine, it is necessary for a primary user to take a protective measures to prevent rewriting, because, if the final user rewrites the content of the memory by mistake, the game will not be reproduced. If the final user erases the content of the memory with malicious intent and illegally inputs another game program, the possibility of sale of the cartridge is lost. Thus, it is necessary for the primary user to take some measures to prohibit erasure. As described above, there have been demands for a nonvolatile memory provided with a prohibition measure for prohibiting rewriting, once data is written.

A conventional method developed for responding to such demands is to protect data by writing numeral values to a security bits provided in the nonvolatile memory, wherein the numerical values include one for permission and another for prohibition in accessing the memory device. In this method, when the writing prohibition data is written in the security bit, it becomes impossible to obtain access except for simultaneous and overall erasure. Data protection by such a security bit is disclosed in the journal of "Electronic Design" pp. 123–128, March, 1983.

Japanese Patent Application, First Publication No. Hei 5-35612 discloses another method of prohibiting additional writing, which comprises an additional writing prohibition circuit which prohibit additional writing after the writing is executed to the last address, in order to prohibit additional writing into a memory such as a one time programmable ROM (Read Only Memory).

The above described conventional apparatuses have a problem in that, for protecting the data, the final user can execute the setting process of the numerical value into the security bit at the final user's side. That is, since it is possible to remove the prohibition state of the security bit or the additional writing prohibition circuit by supplying them with an electric signal, it becomes possible for the final user to rewrite the data with malicious intent.

In the above-described Japanese Patent Application, First Publication No. Hei 5-35612, the designed is such that the additional writing prohibition state cannot be set unless the data is written in the last address.

SUMMARY OF THE INVENTION

It is therefore an objective of the present invention to provide a nonvolatile semiconductor memory device in which the final user can provide the prohibition state for erasing data or prohibiting rewriting, after shipment by the primary user.

According to a first aspect of the present invention, a nonvolatile memory device provided with an erasure prohibiting circuit for prohibiting erasure of the content of data in said nonvolatile memory device is provided, wherein said erasure prohibiting circuit permanently prohibits erasure of the data when an instruction to prohibit erasure is directed from the outside of said nonvolatile memory device.

According to a second aspect, in a nonvolatile memory device according to the first aspect, said erasure prohibiting circuit comprises an erasure prohibiting memory portion for storing either one of first information for prohibiting erasure or second information for permitting erasure.

According to the third aspect, in a nonvolatile memory device according to the second aspect, said erasure prohibiting circuit comprises in the erasure prohibiting memory portion, an erasure setting circuit for writing said first information, and a writing setting circuit for writing said second information.

According to a fourth aspect, a nonvolatile memory device according to the first aspect comprises: an erasure instructing resistor for storing a decoded erasure instruction for instructing erasure of the data content; and an erasing circuit for erasing the data content in a memory cell array based on an output of said erasure instructing resistor; wherein said erasure prohibiting circuit comprises an erasure prohibition control circuit for controlling whether or not an output of said erasure instructing resistor is transmitted to said erasing circuit.

According to a fifth aspect, in a nonvolatile memory device according to the first aspect, the nonvolatile memory device comprises an erasure instructing resistor for storing a decoded erasure instruction; and an erasing circuit for erasing the data content in the memory cell array based on an output of said erasure instructing resistor; wherein, said erasure prohibiting circuit comprises an erasure prohibition control circuit for controlling whether or not said erasure instructing resistor is reset based on a setting state of said erasure prohibition memory portion.

According to a sixth aspect, a nonvolatile memory device according to the third aspect comprises an erasure instructing resistor for storing a decoded erasure instruction for instructing erasure of the data content; and an erasing circuit for erasing the data content in the memory cell array based on the output of said erasure instructing resistor; wherein, said erasure prohibiting circuit comprises an erasure prohibition control circuit for controlling whether or not the output of said erasure instructing resistor is transmitted to said erasing circuit, and an erasure setting circuit is allowed to be energized, only when an output of said erasure prohibition control circuit outputs an erasure permission.

According to a seventh aspect, a nonvolatile memory device according to the third aspect comprises an erasure instructing resistor for storing a decoded erasure instruction; and an erasing circuit for erasing a data content in a memory cell array based on the output of said erasure instructing resistor; wherein said erasure prohibiting circuit comprises an erasure prohibition control circuit for controlling whether or not said erasure instructing resistor is reset, and the erasure setting circuit is allowed to be energized only when the erasure prohibition control circuit outputs an erasure permission.

According to an eighth aspect, in a nonvolatile memory device according to the sixth aspect, said erasure prohibiting circuit is provided with an erasure prohibition release means for forcibly converting the output of said erasure prohibition control circuit to the erasure permission state.

According to a ninth aspect, in a nonvolatile memory device according to the sixth aspect, said erasure prohibiting circuit is provided with an erasure prohibition initializing means for forcibly writing first information into said erasure prohibition memory portion.

According to a tenth aspect, in a nonvolatile memory device according to the eighth aspect, said erasure prohibition release means is made operable only when the nonvolatile memory device is in the form of a wafer.

According to a eleventh aspect, in a nonvolatile memory device according to the ninth aspect, said erasure prohibiting initializing means is made operable only when the nonvolatile memory device is in the form of a wafer.

According to a twelfth aspect, in a nonvolatile memory device, a means to restrict the number of erasure times is provided in the nonvolatile semiconductor memory devices capable of writing and erasing electrically.

According to a thirteenth aspect, in a nonvolatile memory device, nonvolatile semiconductor memory devices capable of writing and erasing electrically comprise a memory means that stores the erasure permitted state or the erasure prohibited state, wherein said memory means is set at the erasure permitted state only when an erasure prohibiting setting means capable of setting either one of the erasure permitted state or the erasure prohibited state, and an erasure prohibition release means for forcibly releasing the erasure prohibited state, and said erasure prohibition release means are in the released state.

According to a fourteenth aspect, in a nonvolatile memory device, the nonvolatile semiconductor memory devices capable of writing and erasing electrically comprise a memory means that stores the erasure permitted state or the erasure prohibited state, and wherein said electrically erasable memory devices comprise an erasure prohibition setting means capable of setting said electrically erasable memory devices at either one of the erasure permitted state or the erasure prohibited state based on information stored in said memory means; and an erasure restricting means for making the memory means be set at the erasure permitted state when the erasure prohibition setting means is in the erasure prohibited state.

According to a fifteenth aspect, a method for manufacturing a nonvolatile memory device of the present invention comprises the steps of forming a plurality of nonvolatile memory chips on a substrate; inspecting a threshold value of a memory cell in each nonvolatile memory chip; initializing an erasure prohibition memory portion that is provided in a erasure prohibiting circuit for prohibiting erasure of a data content for storing either one of first information that prohibits erasure or second information that permits erasure; encapsulating the wafer in packages after it is separated into a plurality of nonvolatile memory chips; writing a predetermined program into said nonvolatile memory chip; and writing erasure prohibition information in said erasure prohibiting memory portion.

BRIEF DESCRIPTION OF THE DRAWINGS

FIG. 6 is a schematic diagram depicting the inner circuit of the erasure prohibition setting circuit 14 shown in FIG. 2.

FIG. 10 is a diagram showing signal conditions of the reset circuit 12 shown in FIG. 9.

DETAILED DESCRIPTION OF THE INVENTION

First, the nonvolatile memory device according to the present invention is described with reference to FIG. 1.

Figure 1:
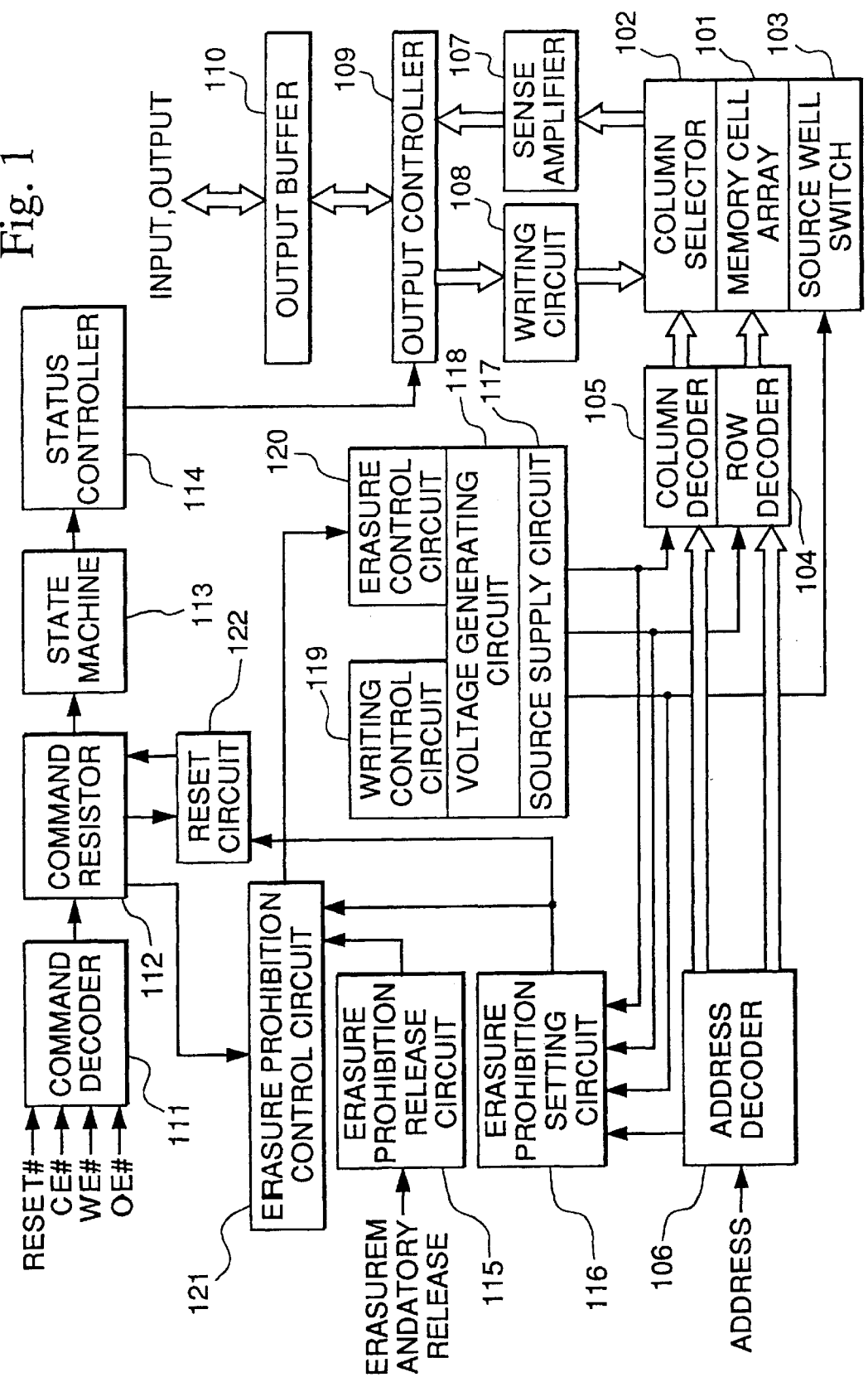
FIG. 1 is a block diagram showing a nonvolatile memory according to the present invention.

In FIG. 1, numeral 101 denotes a memory cell array, in which a plurality of nonvolatile memory cells are arranged in a matrix, numeral 102 denotes a column selector for selecting a bit line of the memory cell array 101, based on the address signal input from the outside. Numeral 103 denotes a source well switch for controlling voltages of a source electrode and a well on the semiconductor substrate of the memory cell array 101. Numerals 104 and 105 denote a row decoder and a column decoder, which generate signals for respectively selecting a word line (not shown) and a pit line (not shown) by decoding the address signal input from the outside. Numeral 106 denotes an address decoder, which holds the address signal supplied from the outside and pre-decodes at the column and row decoders.

Numeral 107 denotes a sense amplifier which senses and amplifies an output from the memory cell array 101 for judging the memory data. Numeral 108 denotes a writing circuit used for writing data in the memory array 101. Numeral 109 denotes an output controller, which latches the output based on the input data of the memory cell array 101 and an output signal of an output data status controller 114. Numeral 110 denotes a buffer which communicates with the outside of the nonvolatile memory and with input and output data. Numeral 111 denotes a command decoder which decodes various signals from the outside such as a reset signal for initializing the present nonvolatile memory (RESET), a chip enable signal for permitting access to the present nonvolatile memory (CE), a write enable signal for permitting writing to the present nonvolatile memory (WE), and an output enable signal for permitting data output (OE), and judges what type of processing is required from the outside.

Numeral 112 denotes a command resistor M which possesses a plurality of resistors for storing commands decoded by the command decoder 111. Numeral 113 denotes a state machine, which operates the present nonvolatile memory according to a predetermined status transition diagram. Numeral 114 denotes a status controller which controls the state machine 113, and which transmits a timing signal for latching the data in the output controller 109. Numeral 119 denotes a writing control circuit, which controls the voltage generating circuit 116 at the time of writing data in the memory cell array. Numeral 120 denotes an erasure control circuit, which controls the voltage generating circuit 116 at the time of writing data in the memory-cell array 101. Numeral 118 denotes a voltage generating circuit, used for generating necessary voltages for respective operations of erasing, writing and reading of the present nonvolatile memory. Numeral 117 denotes a voltage supplying circuit which supplies voltages generated by the voltage generating circuit 118 to the present nonvolatile memory in response to the above described various operation modes.

Hereinafter, an outline of various circuits shown in FIG. 1 is described, and the detailed explanation of those circuits will be given later. Numeral 121 denotes an erasure prohibiting circuit, which inactivates the erasure signal supplied to the erasure control circuit 120 when erasure is prohibited. Numeral 122 denotes a reset circuit for executing the resetting of the erasure command to conform with conditions of the hereinafter described protection fuse circuit when the erasure command is given to the memory cell array 101, and for resetting the erasure commands by giving a command to the command resistor 112 when the command is input from the outside.

The present reset circuit 122 is activated and the inner circuit is returned to the initial state, when the electronic equipment is powered and a RESET signal is input into the nonvolatile memory, or when a command, which is not defined in the command decoder, is supplied from the outside by mistake.

Numeral 115 denotes an erasure prohibition release circuit, which is used just after the nonvolatile memory is produced for setting the erasure prohibition setting circuit 116 to the erasure permitting state or for changing the setting of the erasure prohibiting setting circuit 116 from the erasure prohibited state to the releasing state. This setting procedure can only be executed by the manufacturer. Numeral 116 denotes an erasure prohibition setting circuit and the prohibition state of the erasure prohibiting circuit once set can be removed by the output signal of the erasure prohibition release circuit which can only be operated by the manufacturer.

When the erasure prohibition setting circuit 116 is set at the state of "erasable", it is possible to erase at any number of times, regardless of what the output of the erasure prohibition circuit 115 is. Thereafter, if the erasure prohibition setting command is input and the erasure prohibition setting circuit is set at the "nonerasable" state, the memory cell array 101 becomes nonerasable.

Hereinafter, the nonvolatile memory according to the first embodiment of the present invention is described with reference to the drawings.

Figure 2:
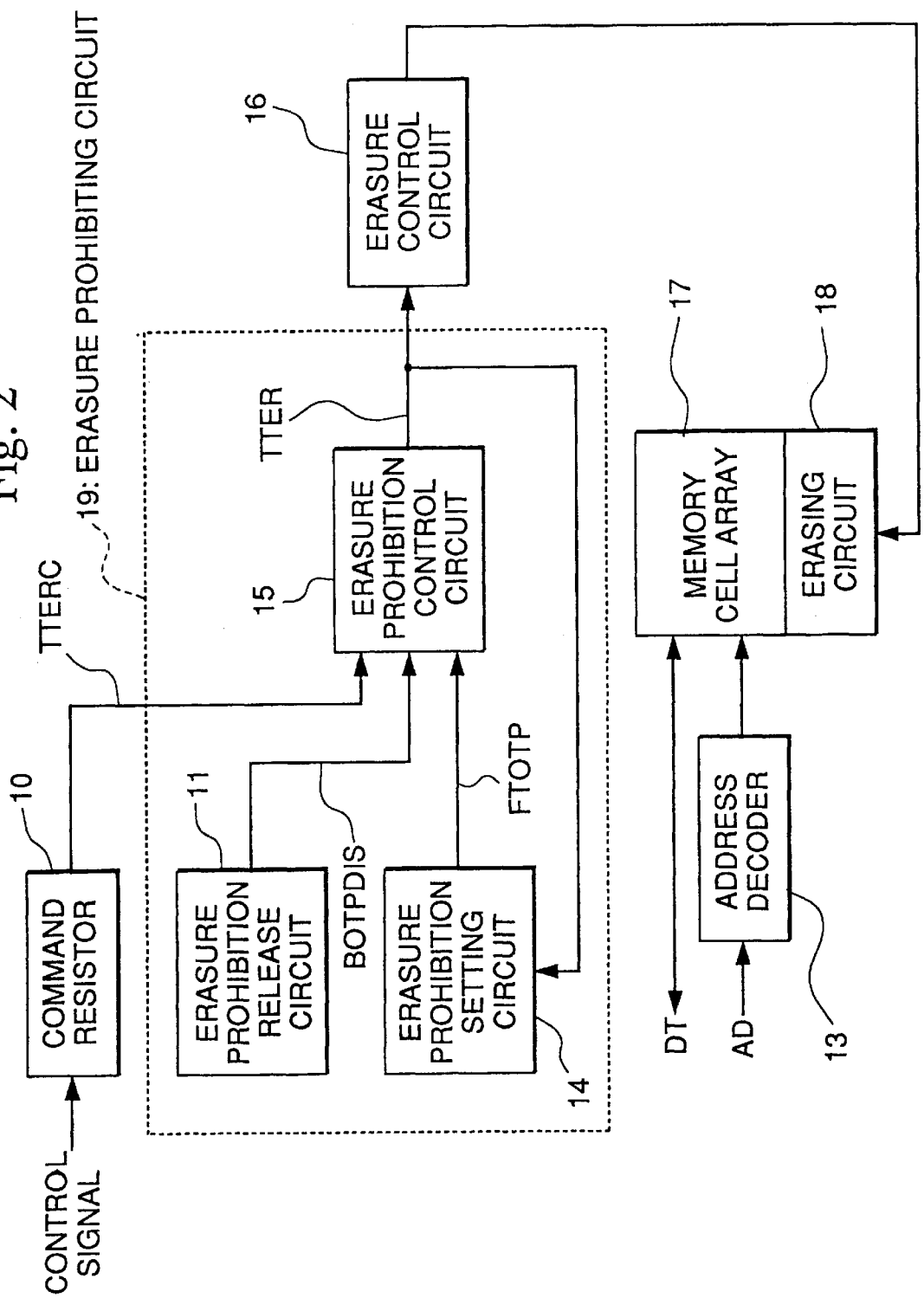
FIG. 2 is a block diagram showing the construction of the nonvolatile memory according to the first embodiment of the present invention.

FIG. 2 is a block diagram showing the structure of the nonvolatile memory device according to the first embodiment of the present invention. In FIG. 2, the block 19 surrounded by a dotted line is the erasure prohibiting circuit of the present invention.

Numeral 17 (corresponding to 101 in FIG. 1) denotes the memory cell array of the present nonvolatile memory. An address signal AD supplied from the outside is decoded by an address decoder 13 (corresponding to 104, 105, and 106 in FIG. 1), and stored information of the memory cell, selected by the result of decoding, is either read and output or input and written.

A resistor (not shown) in the command resistor 10 (corresponding to 112 in FIG. 1) outputs an erasure request signal TTERC when an erasure request command is input from the outside.

In general, the nonvolatile memory accepts two commands such as an automatic erasure command and a test erasure request command. When the automatic erasure command is input, after executing writing processing, a plurality of memory cells are collectively erased (hereinafter called a collective erasure operation), and the erasure is executed if each memory cell does not reach a certain threshold value. In addition, the threshold value of each cell is checked by changing the threshold criteria (hereinafter called an excess erasure verification processing), and writing restoring processing is executed for memory cells whose threshold values are below the predetermined level. The above processing is automatically repeated in the nonvolatile memory, and the threshold value of the memory cell array 17 converges in a prescribed range. This state is called the erased state.

The test erasure request command is the command for executing only the above-described collective erasure processing. When this command is input or when the collective erasure processing is executed in response to the automatic erasure command, the resistor M in the command resistor 10 outputs the signal TTERC.

Various control signals such as a reset signal (RESET) for initializing the present nonvolatile memory, a chip enable signal (CE) for permitting accessing to the present nonvolatile memory, a write enable (WE) for permitting writing in the present nonvolatile memory, and an output enable signal (OE) for permitting data output from the present nonvolatile memory are input into the command decoder 111 (FIG. 1), and stored in the command resistor 10 after being decoded for controlling the nonvolatile memory.

Numeral 14 (corresponding to numeral 116 in FIG. 1) denotes an erasure prohibition setting circuit, which contains one bit of the erasure prohibition memory element for storing the erasure prohibiting information when prohibition of erasing data of the memory cell array 17 is instructed by the external command given from the outside. It is indicated that collective erasure is prohibited when the signal FTOTP, which is the output of the erasure prohibition setting circuit 14, is "H" (High logic value). In contrast, when the output of the erasure prohibition setting circuit 14 is "Low" (Low logic value), the erasure of data in the memory cell data is possible. As shown above, it is possible to set the memory cell into the erasure prohibited state by giving a command by setting the erasure prohibiting circuit 14 to "H", and it becomes possible to remove the data erasure prohibited state by use of a erasure prohibition release circuit 11.

Numeral 11 in FIG. 2 (corresponding to numeral 115 in FIG. 1) denotes an erasure prohibition release circuit, which outputs a signal BOTPDIS. When the signal BOTPDIS is in the H state, the signal FTOTP becomes invalid, and the data erasure prohibition state is removed irrespective of the value of the state of the signal BOTPDIS. That is, the collective erasure of the nonvolatile memory is allowed. When the signal BOTPDIS is "H", the content of the erasure prohibition memory element in the erasure prohibition setting circuit can be removed for conversion to "erasable". When the signal BOTPDIS is "L", the signal FTOTP becomes valid, and whether or not data erasure is prohibited is determined by the value of the signal FTOTP.

Numeral 15 in FIG. 2 (corresponding to numeral 121 FIG. 1) is the erasure prohibiting control circuit, which outputs a signal TTER for the above-described input signals such as the signal TTERC, the signal BOTPDIS, and the signal FTOTP. The signal TTER is connected to the erasure prohibition circuit 16, and the erasure setting switch 36 outputs the value indicating "erasable" as the signal FTOTP. (Actually, a processing is executed to store the value to set "erasable" in the erasure prohibiting memory element.)

That is, when the erasure prohibition setting circuit 14 or the erasure prohibition release circuit 11 is in the "erasable" state, the erasure request signal TTERC output from the command resistor 10 can pass through the erasure prohibition control circuit 15 and the signal TTERC is then supplied to the erasure control circuit 16 for erasing the memory cell array 17. In contrast, when the erasure prohibition release circuit 11 is set in the "nonerasable" state, the signal TTREC is not supplied to the erasure control circuit 16 and the erasure of the memory cell array is not allowed, since the erasure request signal TTERC cannot pass through the erasure prohibition control circuit 15.

Numeral 16 in FIG. 2 (corresponding to numeral 120 in FIG. 1) denotes a erasure control circuit, which execute the erasing operation of the data in the memory cell array 17 by the output signal TTER from the erasure prohibition control circuit 15. Numeral 18 (corresponding to 117, 118, 102, 103, 104 and 105 in FIG. 1) is the erasing circuit for conducting erasing of the memory cell array 17.

Next, the operation of the first embodiment of the present invention is described with reference to FIG. 3.

Figure 3:
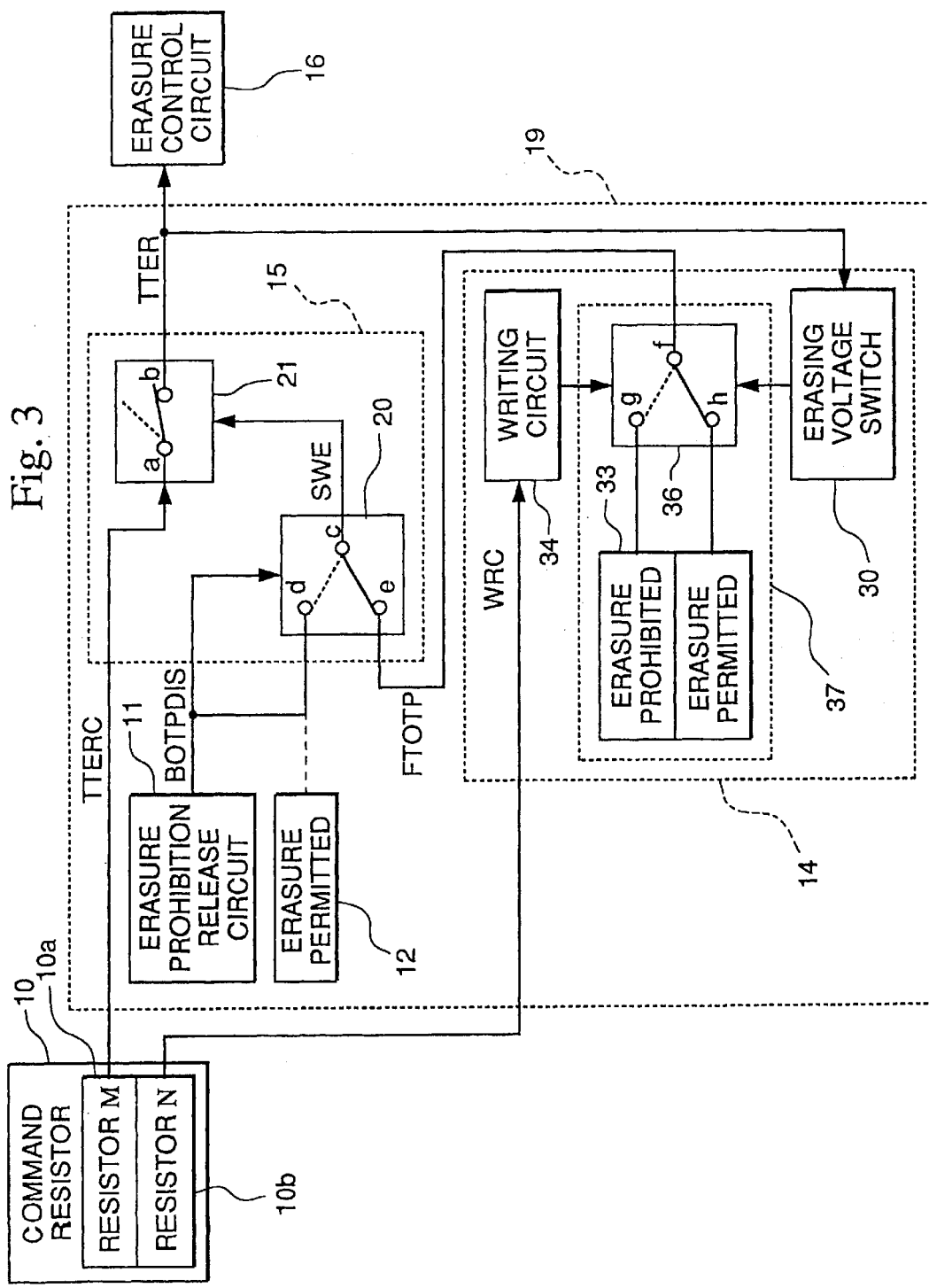
FIG. 3 is a block diagram for explaining a principle of the erasure prohibiting circuit.

FIG. 3 is a block diagram for explaining an operational principle of the erasure prohibiting circuit 19. The same blocks as those in FIG. 2 are denoted by the same number and the detailed explanations are omitted. FIG. 3 depicts the details of the erasure prohibiting circuit for explaining functions of the erasure prohibition control circuit 15 and the erasure prohibition setting circuits 14. The total function is the same as that shown in the above description.

The erasure prohibition setting circuit 14 comprises an erasure setting switch 36, erasure prohibiting memory element 33, a writing circuit 34, and an erasure voltage switch 30. The erasure prohibiting memory element 33 can store either one of numeral values of "erasable" or "nonerasable".

The erasure setting switch 36 outputs either one of erasable or nonerasable as the signal FTOTP. When the signal TTER is the "erasure request", the erasure voltgae switch 30 is activated for switching the connection between the terminal f with g to h. If the connection is between the terminal f to the terminal h, the original connection is maintained (shown by the real line). Thus, the erasure setting switch 36 outputs the value of "erasable" as the signal ETOTP (actually, the "erasable" value is stored in the erasure prohibiting memory element 33).

In contrast, if the value of the signal ETOTP is "nonerasable", the erasing switch 30 is not activated and the connection of the terminal f cannot be made. However, as shown hereinafter, the connection of the terminal f of the erasure setting switch 36 can be switched from the h to g terminals. Accordingly, if the signal TTER is "nonerasable", the erasure setting switch 36 can not be turned to "erasable", even if it is possible for switching into the value of "nonerasable".

When a signal WRC output from the register N is activated, the writing circuit 34 switches connection of the terminal f from the terminal h to the terminal g, or if the original connection is from f to g (shown by a dotted line), the connection is maintained. Thus, the erasure setting switch 36 outputs a "nonerasable" value as the signal FTOTP (actually, the numeral value of the "nonerasable" state is stored in the erasure prohibiting memory element).

In contrast, if the signal WRC is activated, a writing circuit 34 is not operated and the connection between the terminal f and the terminal g cannot be switched. As a result, the erasure voltage switch 30 and the writing switch 34 cannot change the connection of the terminal of the erasure setting switch 36.

The erasure prohibit switch 20 outputs either one of the signal FLOTP or the numerical value of the "erasable" state. When the output of the sigmnal BOTPDIS is in the first level, the terminal c of the erasure prohibition release switch 20 is connected with the terminal d (a real line) and the erasure prohibition release switch 20 outputs the value of the "erasable" state. By making the level of the "erasable" value consistent with the first level, the value of the signal BOTPDIS output by the erasure prohibition release circuit 11 can be also used as the erasable value. When the output of the signal BOTPDIS is at the second level, the terminal c of the erasure prohibition release switch 20 is connected with the terminal e, the erasure prohibition release switch 20 outputs a signal FTOTP as the signal SWE.

The erasure prohibition control circuit 15 comprises an erasure signal switch 21, and an erasure prohibition release switch 20. The open and close operation of the erasure signal switch 21 is controlled by the signal SWE, output from the erasure prohibition release switch 20. When the signal SWE is in the "erasable" state, the erasing signal switch is in the closed state (shown by a real line in the figure), and the terminal a is connected to the terminal b. Therefore, the collective erasure signal TTERC output from the register M of the command resistor 10 is supplied to the erasure control circuit 16 for the collective erasure operation.

When the signal SWE is nonerasable, the erasure signal switching circuit 21 is in an open state (shown by the dotted line), and the terminal a is not connected with the terminal b. Thus, the collective erasure signal TTERC is not supplied to the erasure control circuit 16 so that the collective erasure is not executed.

Figure 4:
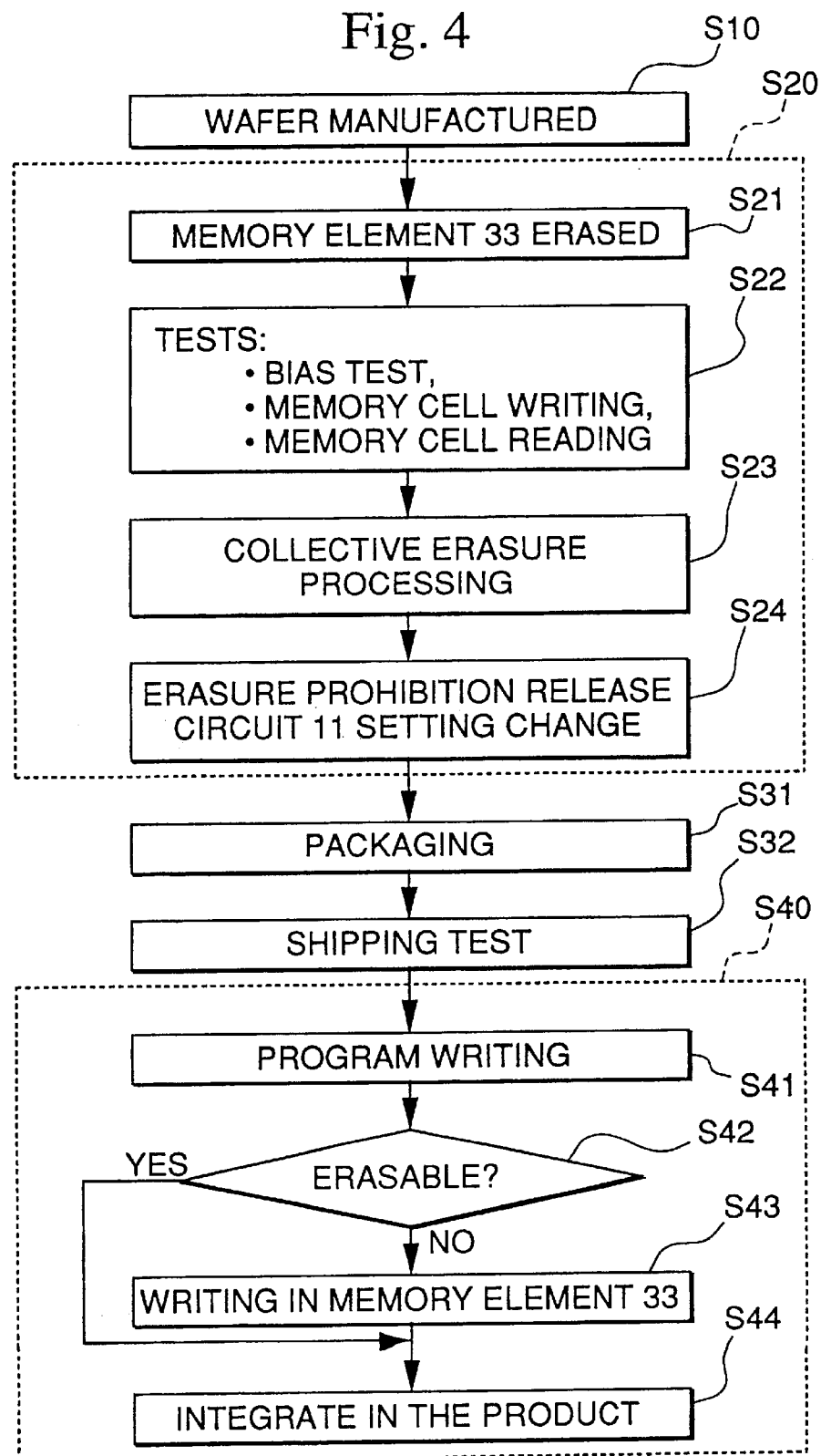
FIG. 4 is a flow diagram showing the manufacturing process of the nonvolatile semiconductor memory device.

FIG. 4 is a flow chart showing the manufacturing processes of the nonvolatile semiconductor memory device.

With reference to FIG. 4 together with the above FIG. 3, the operation of the nonvolatile semiconductor memory device is described.

At step S10, a plurality of nonvolatile memories is formed on the wafer and the diffusion process is completed. In step S20, various inspections and setting operations are executed for nonvolatile memories in the form of a wafer.

Among various processing operations in the form of a wafer, an erasing operation (input a value to set "writable") of the erasure prohibiting memory element 33 is executed at step 21. In this step, the erasure prohibition release circuit 11 outputs the first level value of the signal BOTPDIS, and the terminal a is connected with the terminal c, so that the erasure prohibition release switch 20 outputs the value of "erasable". Consequently, the erasure signal switch circuit 21 is turned to a closed state.

Subsequently, an erasure request command from the outside such as from a tester (not shown) is input into the resistor M of the command resistor 10, which outputs the signal TTER. Since the erasure signal switch 21 is closed, the erasure request command is input as the signal TTER into the erasure control circuit 16 and also into the erasure voltage switch 30. Accordingly, the terminal f of the erasure setting switch 36 is connected with the terminal h irrespective of the initial state, and the value in the erasure prohibiting memory element 33 is erased. And, the erasure prohibition setting circuit 14 outputs the value of "erasable" as an output signal FTOTP.

Subsequently, in step S22, the tester supplies to the nonvolatile memory pad an address signal AD, data DT, and control signals, and the nonvolatile memories are checked as to whether they satisfy the required standard after the execution of various tests such as bias tests and writing/reading as wafers Next, in step S23, the tester inputs an automatic erasing command, and collective erasing of the whole memory cell is executed. In this step, an automatic erasing command is input from the outside such as from a tester (not shown) to the resistor M in the command resistor 10, which outputs the signal TTERC. Since the erasure signal switch 21 is in the closed state, the automatic erasing command is input into the erasure control circuit 16 as the signal TTER and by activating the erasing circuit 18, an entire memory cell in the memory cell array 17 (FIG. 2) or a specific block of the memory cell are collectively erased.

In step S24, the setting of the erasure prohibition release circuit 11 is changed and the erasure prohibition release circuit 11 outputs a second level as the signal BOTPDIS. The change of setting of the erasure prohibition release circuit 11 can be executed, as described later, by suspending the supply of a bias from a tester, or by cutting a fuse. As a result, the terminal c of the erasure prohibition release switch 20 is changed so as to be connected with the terminal e, the open-close operation of the erasure signal switch circuit 21 is determined by the signal FTOTP set in the erasure prohibition setting circuit 14. Here, since the signal FTOTP is set "erasable", the erasure signal switch circuit 21 remains closed.

In the step S31, the wafer is cut into a plurality of nonvolatile memory chips by a dicing operation. Each nonvolatile chip, the quality of which was evaluated as good, is loaded onto a lead frame and sealed with a resin or the like.

In step S33, various tests similar to steps S22 and S23 and the collective erasing are executed as the delivery inspection. At this time, the erasure prohibition memory element 33 in the erasure prohibition setting circuit 14 stores the value of "erasable", the erasure signal switch is turned into closed. Thus, even if a test data is written in the memory cell array by executing the writing/reading inspection, the memory cell array 17 can be erased by inputting an erasing command from the outside to the command resistor 10.

Thereafter, the nonvolatile memory device is delivered from the manufacturer to the primary user for executing necessary processing at step S40. In step S41, the primary user writes a prescribed program into the memory cell array 17 of the nonvolatile memory device.

In step S42, if an opportunity for erasure of the program written in the nonvolatile memory is to be given to the final user, the routine goes to step S44, wherein the primary user ships the nonvolatile memory product after being integrated into an electronic equipment. If there is no opportunity for the final user to erase the nonvolatile memory device later or if erasure is to be prohibited, the primary user executes writing into the memory element 33.

Writing into the erasure prohibition memory element 33 is executed practically by first writing a writing request command from a tester (not shown) into a resistor N in the erasure prohibition memory element 33 for outputting the signal WRS. The writing circuit 34 changes the connection of the terminal f from the terminal g to the terminal h and changes the value of the erasure prohibition memory element 33 to "nonerasable". The erasure prohibition setting circuit 14 outputs the value of "nonerasable", as the output signal FTOTP, which is supplied to the erasure signal switch 21 through the erasure prohibition release switch 20. As a result, the erasure signal switch is turned to the closed state and the erasure request command TTERC output from the command resistor 10 is not transmitted to the erasure control circuit 16, so that the memory cell array 17 cannot be erased. At the same time, since the signal TTER is not transmitted to the erasure voltage switch 30, the erasure setting switch 36 can not be switched to "erasable".

In step S44, the primary user ships products in which nonvolatile memory devices containing written programs are installed.

Here, steps S42 and 43 may be executed after the step S32 by the manufacturer. In such a case, the primary user cannot execute an erasing process.

FIG. 6 is a diagram showing the practical inner circuit of the erasure prohibition setting circuit 14. Numeral 33 denotes an erasure prohibiting memory element as a memory element for storing one bit, in which a sense amplifier 31 is connected to the drain side of the memory element for outputting the output value of the erasure prohibiting setting circuit 14 as the signal FTOTP to the outside. In the interior of the sense amplifier 31, the source terminal of an N-type transistor 31b is grounded, and the drain terminal is connected with the source voltage through a resistor 31a. The source terminal of an n-type transistor 31c is connected to the drain terminal of the erasure prohibition memory element 33, and its drain terminal is connected to the source voltage through a resistor 31c. Furthermore, the gate terminal of the N-type transistor 31c is connected between the drain terminal of the N-type transistor 31b and the resistor 31a and the gate terminal of the N-type transistor 31b is connected to the source terminal of the N-type transistor 31c.

The transistors 31b and 31c and the resistor 31a compose a biasing circuit, which supplies a predetermined biasing voltage to the drain of the erasure prohibition memory element 33. At this time, a current flowing in the erasure prohibition memory element 33 flows to the resistor 31f through the transistor 31c, and a reading voltage is generated at the drain of the transistor 31c. An inverter 31e judges whether or not the reading voltage is less than a predetermined value and the results of the judgement is output after being amplified as the signal FTOTP.

When data "0" is written in the erasure prohibition memory element 33, the output of the signal FTOTP becomes "H", which outputs a signal indicating that this nonvolatile memory device is "nonerasable". The writing process of the data "0" is carried out by the writing circuit 34 and the word driver 32. That is, an electron is injected into the floating gate of the erasure prohibiting memory device 33 by supplying a voltage of 10 to 12V from the word driver 32 to a control gate of the erasure prohibiting memory element 33, supplying a voltage of 5 to 6 V from the writing circuit 34 to the drain of the erasure prohibiting memory element 33, supplying a voltage of 0 V from the source well switch 35 to the source of the erasure prohibiting memory element 33, and supplying a voltage of −10 to −12 V from the source well switch 35 to the well.

Numeral 30 denotes an erasure voltage switch. When the data of the erasure prohibiting memory element 33 is deleted, the data is changed to "1", the signal FTOTP is also changed to "L", the erasure voltage switch 30 outputs the data of "erasable". The erasing operation is carried out by the erasure voltage switch 30 and the word driver 32. That is, electron is injected from the floating gate of the erasure prohibiting memory device 33 to the well by supplying a voltage of −10 to −12V from the word driver 32 to a control gate of the erasure prohibiting memory element 33, making the drain of the erasure prohibiting memory element open by the erasure voltage switch, making the source of the erasure prohibiting memory element 33 open by the erasure voltage switch 30, and supplying a voltage of −10 to −12 V to the well.

Numeral 35 denotes a source well switch, which is used for controlling a voltage between the source electrode and the well on the semiconductor substrate. The data of the erasure prohibiting memory element 33 is read by supplying a voltage of approximately 4 V from the word driver 32 to the erasure prohibiting memory element 33, supplying a voltage of approximately 1 V from the sense amplifier 31 to the erasure prohibiting memory element 33, and by supplying a voltage of 0V from the source well switch 35 to the erasure prohibiting memory element 33.

Figure 7A:
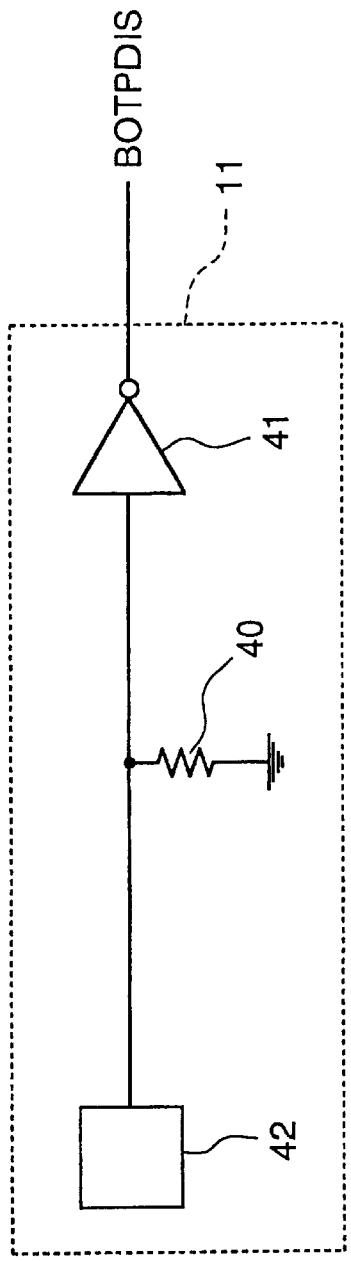
FIGS. 7A and 7B are diagrams showing the inner circuit of the erasure prohibition release circuit 11 in FIG. 2.
Figure 7B:
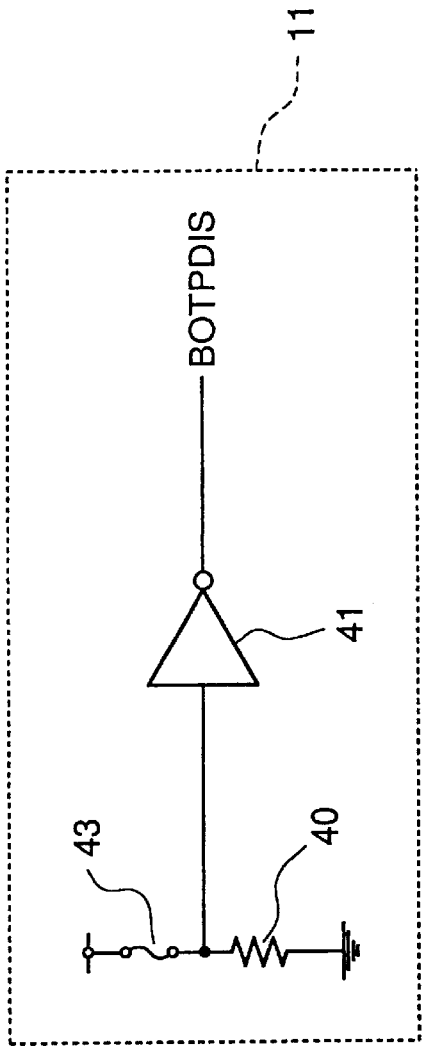

FIGS. 7A and 7B show an example of the internal circuits of the erasure prohibition release circuit 11. In an example shown in FIG. 7A, numeral 40 denotes a resistor, in which, one end is earthed, and the other end is connected with a path to be connected with an inverter 41. When the "H" is given from the outside such as from a tester, the signal is inverted and the signal BOTPDIS of "L" is output. When the signal "L" is given to the PAD 42, or when the PAD 42 is open, the signal BOTPDIS is "H".

The example shown in FIG. 7B is constructed by a fuse 43, in place of the PAD 42 of FIG. 7A, connected in between the source voltage terminal and the connection of the resistor 40 and the inverter 41. When there is a fuse 43, the signal BOTPDIS is normally "L", and when the wire snaps, "H" is output.

That is, in the wafer test stage, the signal BOTPDIS is in the "L" state until at least the erasure prohibition memory element 33 is erased. When the erasure prohibition memory element 33 is erased and the signal FTOTP is changed to "erasable", the fuse is cut by the laser 43 or the like (step S24 in FIG. 4). By cutting the fuse 43, the output BOTPDIS of the erasure prohibition setting circuit 11 is fixed at the state of "H", and whether or not the setting of the erasure prohibition setting circuit is in the "erasable" state is determined depending on the value of the signal FTOTP. However, after the fuse has been cut, and once the erasure prohibition memory element 33 is changed to the "nonerasable" state, the erasure prohibition memory element 33 cannot be returned to the "erasable" state unless it is erased forcibly.

Figure 5:
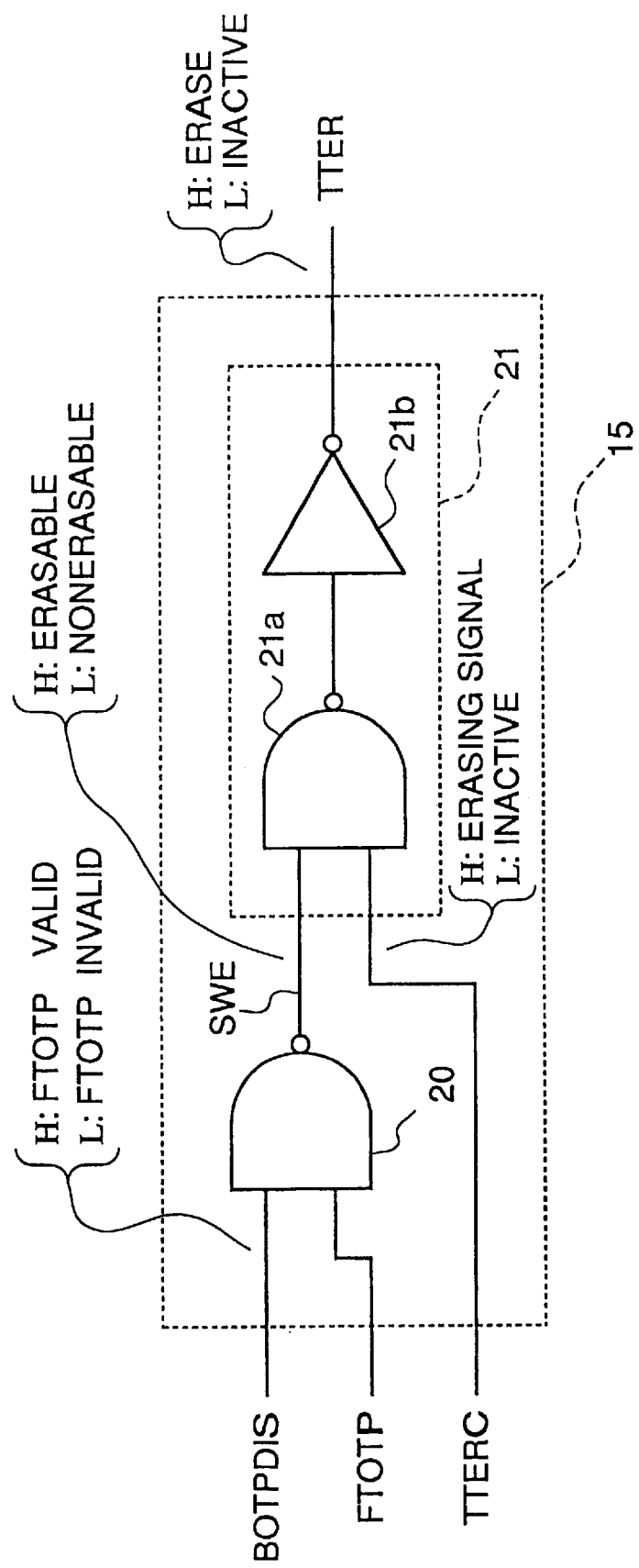
FIG. 5 is a diagram depicting the inner circuit of the erasure prohibition control circuit 15 shown in FIG. 2.

FIG. 5 depicts in detail the internal circuit of the erasure prohibition control circuit 15. In FIG. 5, the signal BOTPDIS and the signal FTOTP are input into a NAND (not AND) 20, and the output and the signal TTERC are input into a two input NAND 21a in a NAND element 21. After the output of the NAND 21a is inverted, the output is obtained as the signal TTER.

If the output BOTPDIS of the erasure prohibition release circuit 11 is "L", and irrespective of whether the value of the signal FTOTP is "H" or "L", the output SWE of the NAND 20 which functions as the erasure prohibition release switch (20 in FIG. 3) is fixed at the "H" state, and the output FTOTP of the erasure prohibition setting circuit 14 is invalid. The value "L" of the output BOTPDIS is inverted by the NAND 20, and the signal SWE is turned to the value of "H" (the "erasable" state). Accordingly, when the erasure request signal TTER is activated into the value "H", the output of the NAND 21a becomes "L"; and when the erasure request signal TTER is fallen in the inactive state of the value "L", the output of the NAND 21a becomes "H", and the signal TTER corresponding to the output of the inverter 21b becomes "L".

Next, when the output BOTPDIS of the erasure prohibition release circuit 11 is "H", the value of the signal FTOTP determines the output SWE of the NAND 20. If the value of the signal FTOTP is "L" ("erasable"), the output SWE of the NAND 20 which functions as the erasure prohibition release switch (20 in FIG. 3) turns to "H" ("erasable"). Accordingly, when the erasure request signal TTERC is activated to "H", the output of the NAND 21a is changed to "L", and the signal TTER corresponding to the output of the inverter 21b is changed to "H". This activated signal TTER is supplied to the erasure control circuit 16 (FIGS. 2 and 3) and the memory cell array 17 (FIG. 2) can be erased.

If the value of the signal FTOTP is "L" ("nonerasable"), even if the erasure request signal TTERC is activated to the value of "H", the output of the NAND 21a is maintained as "H", so that the signal TTER corresponding to the output of the inverter 21b remains as "L", and the erasure request signal TTER cannot be activated. Thus, the memory cell array 17 cannot be activated.

Figure 8:
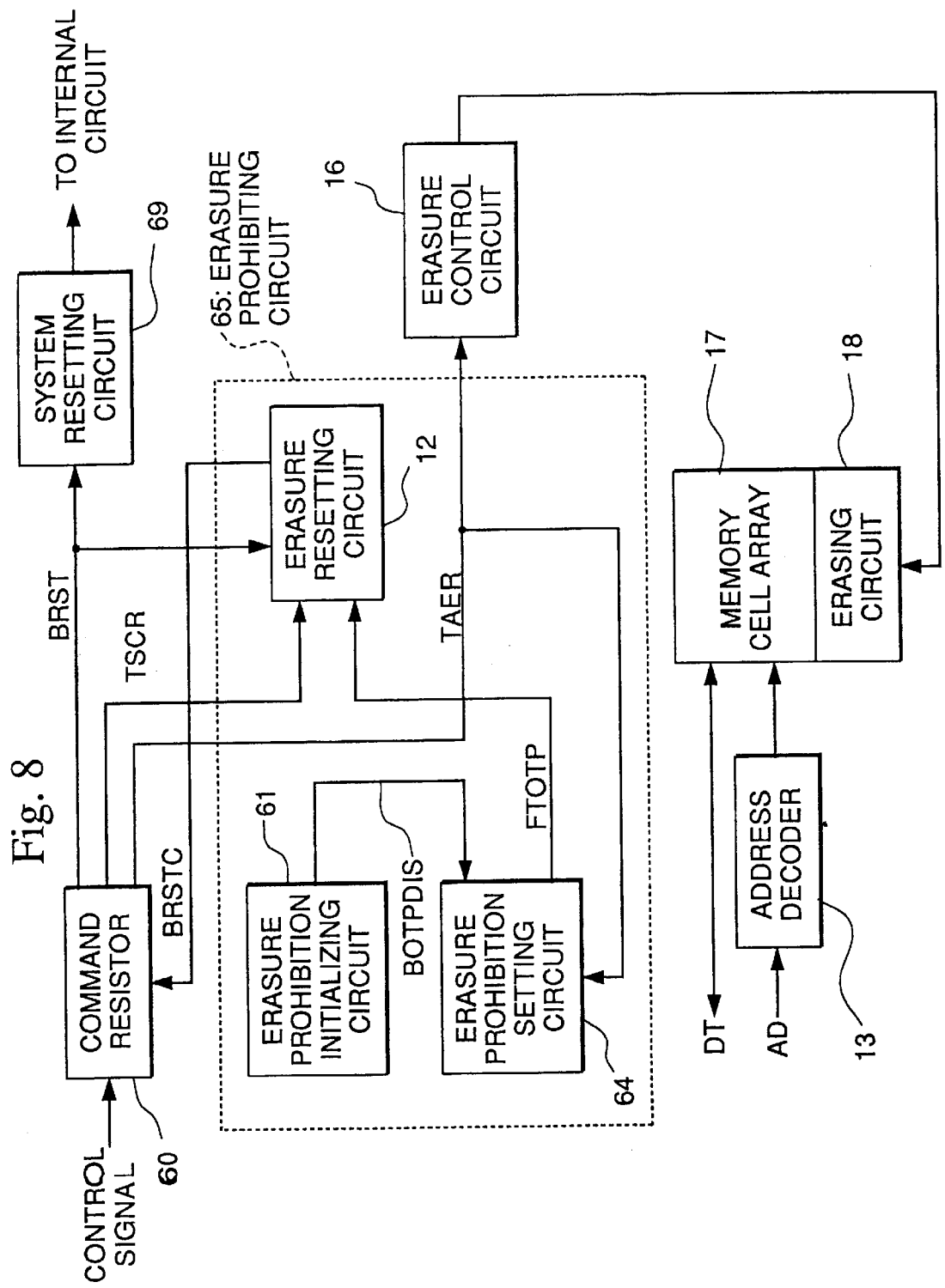
FIG. 8 is a diagram showing the second embodiment of the present invention.

Hereinafter, the second embodiment of the present invention is described with reference to FIG. 8. The same elements as those in the first embodiment are denoted by the same reference numbers, and explanations of those elements are omitted. The command resistor 60 (corresponding to 112 in FIG. 1) is used for storing the decoded command input from the outside. The command resistor comprises a resistor M for storing the erasure request command and a resistor A for storing a reset command.

The resistor A outputs a reset signal BRST and the signal BRST is activated when the power is applied to the nonvolatile memory device, when the user inputs a command by mistake, or when a command is input, which is not defined in the command decoder 111 (FIG. 1). The signal BRST is sent to a system reset circuit 69 and distributed to the internal circuit of the nonvolatile memory. The signal BRST is normally in the "H" state, and when resetting, it changes to the state "L" as pulses. When the signal BRST converts to the "L" state, the internal circuit of the nonvolatile memory is reset and the resistor is initialized.

While the erasure request command is maintained in the resistor M, the signal TSCR in the command resistor 60 is changed into "H", and when the erasure request command is not in the resistor or when another signal is input, the signal TSCR is "L".

The signals TSCR, FTOTP, and BRST are input into the erasure resetting circuit 12 (corresponding to a part of 122 in FIG. 1) and the erasure resetting circuit 12 outputs a signal BRSTC for resetting the resistor M. When the signal BRST is "L", the signal BRSTC becomes "L", irrespective of the values of the signals TSCR and FTOTP. When the signal BRST is "H", and when the signal FTO is "L" (the "erasable" state), the signal BRSTC maintains the state of "H", irrespective of the value of the signal TSCR, so that the resistor is not reset and thus the erasure request command can be output to the erasure control circuit 16.

This erasure resetting circuit 12 corresponds to the erasure prohibition control circuit described in the first embodiment 15, which controls permission or prohibition of the erasure operation.

When the signal BRST is "H", and the signal FTOTP is "H" (the "nonerasable" state), and if the signal TSCR is changed into "H", the signal BRSTC then changes to "L" temporarily and the resistor M is reset. Thereby, even if an erasure request signal is input from the outside, the signal is not output to the erasure control circuit 16, the erasure circuit 18 does not operate and the memory cell array is not erased.

Although the erasure prohibition setting circuit 64 (corresponding to 116 in FIG. 19) has the same structure as that of the erasure prohibition setting circuit 14 in the first embodiment, the signal for erasing the erasure prohibiting memory element 33 differs. That is, the erasure voltage switch 30 executes the erasure operation not based on the signal TTER, but based on the output of the erasure prohibition initializing circuit 61 and the signal TAER.

The erasure prohibition initializing circuit 61 operates the erasure voltage switch 30 based on a signal input from the outside such as from a tester (not shown) for initializing (the memory data is converted to "1", corresponding to "erasable") the erasure prohibiting memory element 33 in the erasure prohibiting setting circuit 64. As a result, the erasure prohibition setting circuit 64 outputs a signal FTOTP in the "L" state ("erasable").

The erasure prohibition setting circuit 64 operates, similar to the first embodiment, the writing circuit 34 by the writing operation command to the erasure prohibition memory element 33, and executes the writing operation to the erasure prohibition memory element 33 (the memory data is converted into "0", the "nonerasable" state).

Figure 9:
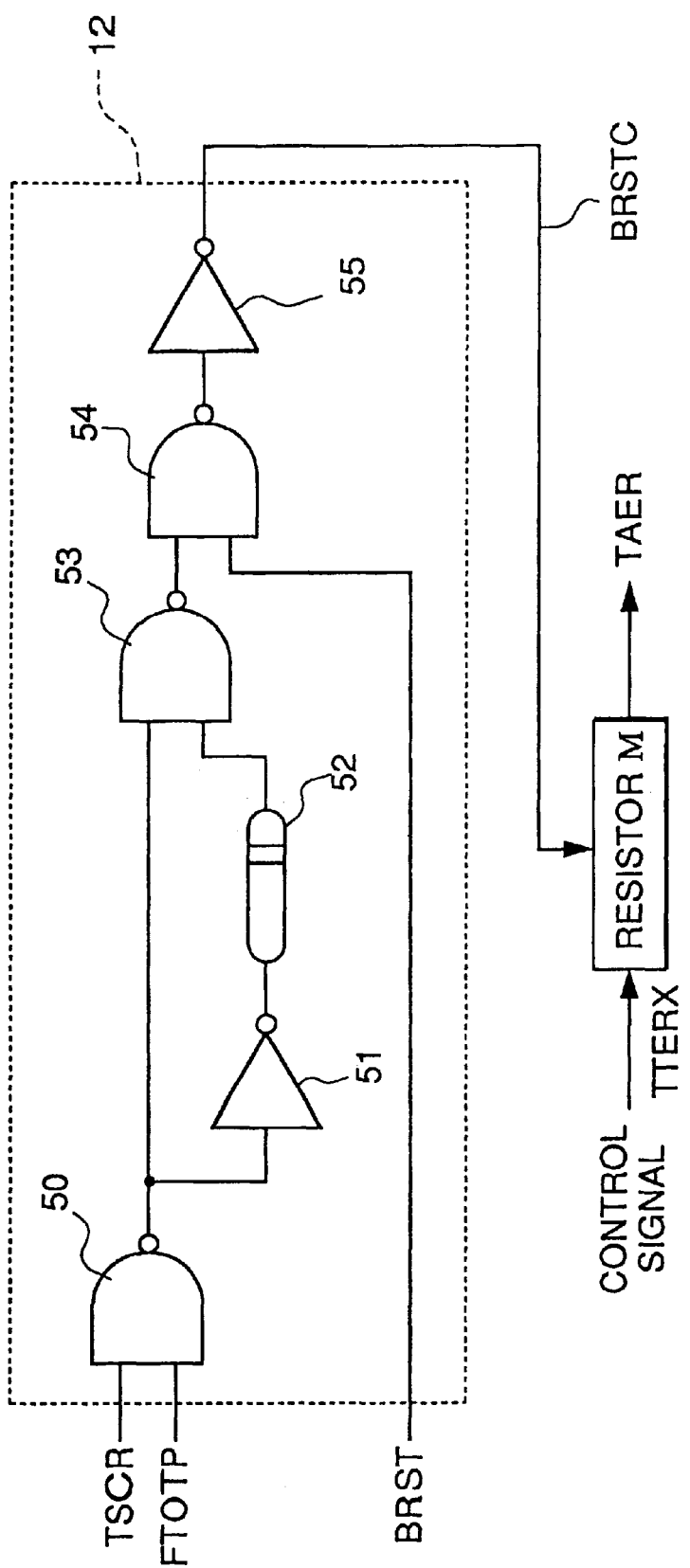
FIG. 9 is a diagram showing the inner circuit of the reset circuit 12 shown in FIG. 2.

FIG. 9 illustrates a detailed circuit diagram showing the erasure resetting circuit 12, and FIG. 10 is a diagram for explaining the structure and the operation of the erasure resetting circuit 122. Numerals 50, 53, and 54 are two-input NAND circuits, numerals 51 and 53 are inverters, and 52 is a delay element for outputting an input after giving it a predetermined delay to an input.

When a reset command is input into the command decoder 111 (FIG. 1) at a time t1 (FIG. 10A), the signal BRST is converted to "L", and the specified circuit in the nonvolatile memory is reset (FIG. 10B). The signal BRST is also input into the reset circuit 12, and, irrespective of the output of the NAND 53, the NAND 54 is at "H", and the output BRSTC of the inverter 55 is at "L" (FIG. 10H). Consequently, the resistor M in the command resistor 60 is reset. During normal operation, both the signal BRST and the output BRSTC are maintained at "H", respectively.

When the first erasure command is input at time t2 (FIG. 10A), the signal is converted to "H" while the erasing command is input (FIG. 10C). While, the erasing command is decoded and the signal TTERX is stored in the resistor M (FIG. 10I). If the signal FTOTP is in the "L" state ("erasable") (FIG. 10D), the output of the NAND 50 is maintained at "H" (FIG. 10E), and the output of the NAND 53 remains at "H" (FIG. 10G) because outputs of the inverter 51 and the delay element 52 remain "L" (FIG. 10F). Therefore, the output of the NAND 54 remains "L", and the output BRSTC of the inverter 55 remains "H" (FIG. 10H). That is, the reset signal BRSTC is maintained in an inactive state.

The signal TTERX stored in the resistor M is output to the erasure control circuit 16 as the signal TAER without being reset at time t3 (FIG. 10J) and, by activating the erasure circuit 18, executes the collective erasure operation. Next, it is assumed that the signal FTOTP is converted into "H" (the "nonerasable" state) (FIG. 10D) at time t4. If the second erasing command is input at time t5 (FIG. 10A), the signal TSCR is converted to "H", during a period that the erasure command is input (FIG. 10C). The erasure command is decoded and the decoded signal TSCR is stored in the resistor M. Since the input of the NAND 50 is turned to "H", the output of the NAND 5 is converted to "L" (FIG. 10E). This signal is inverted by the inverter 51 and is output after being delayed for a predetermined period of time (FIG. 10F).

When the inputs of the NANDs 53 are both turned to "H", the output of the NAND 53 is converted to "L" (FIG. 10E). Accordingly, the output of the NAND 54 changes to "H" and the output BRSTC of the inverter 55 changes to "L" (FIG. 10H).

In contrast, the signal TTERX stored in the resistor M is reset by resetting the resistor M, since the erasure resetting signal BRSTC is turned into "L" temporarily (FIG. 10J). Since the erasing signal TAER is not output to the erasure control circuit 16 (a dotted line in FIG. 10J) and the erasure circuit does not operate, the collective erasing cannot be executed. Thereafter, at time t7, although the data indicating the address of the erasing block is input, the data is cancelled because the erasure request signal TAER is already set.

The first and second erasure commands shown in FIG. 10 are respectively composed of a plurality of bus cycles, in order to avoid execution of the erasure of the memory cell array 17 by malfunction. For example, in the first to fourth bus cycles, the erasing headers "AAH", "55H", "AAH", and "55H" (H means the hexadecimal representation) are input from the CPU to the data bus of the nonvolatile memory, and the chip erasing command "10H" is output at the sixth bus cycle. Thus, it takes time from the time that the first erasing command is decoded and the signal TTERX is stored in the resistor M (the time t2 of FIG. 10) to time t3 that the signal TAER is output. If it is designed that the reset signal BRST is activated when the chip erasing command 10H is input at the sixth bus cycle, the erasure request signal can be reset.

In the above explanation, the settings have been such that the output signal BOTPDIS of the erasure prohibiting initializing circuit 61 is directly input into the erasure prohibition setting circuit 64. However, the construction may be changed such that the erasure prohibition initializing circuit 61 can be the same as that used in the first embodiment (FIG. 7A and 7B), and the output signal BOTPDIS may be input into one of three input type NAND circuits 50', used in place of the two-input type NAND circuit 50.

As shown above, the second embodiment of the present invention determines whether or not the input erasing command is reset depending upon the setting condition of the erasure prohibition setting circuit 64, and if the setting is in the "erasure prohibition" state, it is not possible to erase the memory cell array 17 even if the erasing command is input. In addition, since it becomes not possible to erase the erasure prohibition memory device 33 in the erasure prohibition setting circuit 64, an "erasable" state cannot be reached unless the erasure prohibition initializing circuit 61 is energized. The erasure prohibition initializing circuit 61 can be set at a desired signal value when the memory device is in the wafer state, but the signal value cannot be altered from the outside when the memory device is sealed in a package, so that it is not possible to convert the memory device into an "erasable" state.

However, the memory device can be set to an "erasable" state, by setting the erasure prohibition setting circuit 64 to an erasable state before assembly into the package. Thereby, the memory cell array 17 can be erased even after the test data is written in the memory cell array 17. If the primary user find bug or the like after writing a program in the memory cell array 17, it is possible to erase and re-write the program, without the need to abandon the nonvolatile memory devices.

When the manufacturer or the primary user judges that the contents stored in the memory device do not require further rewriting operations, the "nonerasable" state is provided by writing "0" in the erasure prohibition memory element 33. In this state, an erasure operation is not possible, because the erasure command is reset and the erasure command is not transmitted to the erasing circuit. As shown above, the erasure prohibiting circuit 65 prohibits the erasure of the erasure prohibition memory element 33 by outputting "the nonerasable" signal for prohibiting the erasure of the erasure prohibition memory element. That is, the erasure prohibiting circuit can set to the "nonerasable" state irreversibly.

In general, when the nonvolatile memory device is manufactured, the quality of the gate insulating films is varied due to the fluctuation of the manufacturing conditions. The gate insulating film of nonvolatile memory devices often deteriorates due to repeated erasure operations and, as a result, a charge holding property of the floating gate is lowered. Furthermore, there are some novolatile memory devices whose memory requires time to erase. Since such a memory device necessitates to increase a number of erasure operations, the gate insulating film will be degraded which results in a reduction of the charge holding property.

A nonvolatile memory device which can be used as a one-time PROM is provided by utilizing the present invention and by restricting the number of erasing operations within a predetermined number. The present nonvolatile memory device can be used without generating defective products due simply to malfunctions in the erasure operation in spite of the normal writing operation.

The limitation of the number of the erasure operations can be achieved by providing an instrument which can calculate the number of erasure operations, and by converting the device into a nonerasable state when the number of erasing times exceeds a predetermined number. The instrument may be provided in a CPU, connected to the nonvolatile memory device, and the nonerasable state may be attained by writing into the erasure prohibition memory device 33 of the present nonvoaltile memory device.

The conventional erasure prohibiting circuit is a type of circuit which stores flags representing the nonerasable state or the erasable state. Thus, even when a computer provided with a nonvolatile memory device, which is converted into the nonerasable state in advance, is supplied to a final user, it becomes possible for the final user to erase the memory device by inputting a specified command, so that the final user may write new information into the nonvolatile memory.

In contrast, the nonvolatile memory device of the present invention is designed such that it is impossible to execute erasing by a command given from the outside, even if the final user intends to execute unfair rewriting, the user cannot implement the erasing. In addition, the final user will never erase important information in the memory by mistake.

In general, the letter "L" or "H" is not allowed to be written in the nonvolatile memory devices, dissimilar to DRAM or SRAM. For example, the whole memory cell is converted into "H" by the erasure operation and the writing is executed for a memory cell selected for being converted into "L". Thus, by prohibiting the erasure operation, it becomes impossible for memory cells written into "L" to be reconverted into "H". That is, if the final user cannot execute the erasure operation, information that the final user intends to store cannot be written into the memory cell. Therefore, in order to prevent unfair writing, it is sufficient to prohibit erasure. However, it is more desirable to prohibit writing to prevent erroneous erasure or erroneous writing. One of the measures to prohibit writing is the provision of a circuit capable of restricting the number of writing operations, similar to the circuit shown in the first or the second embodiment.

The nonvolatile memory device of the present invention is capable of executing the erasure operation when necessary up until the erasure prohibition is set, so that it is possible to erase the shipping test data after the tests which are conducted in the course of testing after packaging.

When the primary user writes and inspects a program in a nonvolatile memory, and when there is a mistake in the program, it is possible to rewrite a revised program after erasing the mistake in the program. As described, the nonvolatile memory devices can be reused without the need to discard them, and the nonvolatile memory devices can be maintained at reduced cost.

As described above, the nonvolatile memory device of the present invention is converted into a one-time PROM from a writable nonvolatile memory by once being subjected to a data prohibition operation; and after being packaged and shipped, it is impossible for the nonvolatile memory device to be reconverted to the writable nonvolatile memory. When reconversion is desired, first a potential of "H" is applied to the PAD 42. The signal BOTPDIS is then changed to "L". Therefore, as shown in FIG. 5, the signal FTOTP="H", and once the data erasure request is produced, the signal TTERC="H", thus the signal TTER="H", which indicates that the data erasure is permitted.

Furthermore, as shown in FIG. 6, the signal TTER activates the erasure voltage switch 30 of the erasure prohibition setting circuit 14, the data in the erasure prohibition memory element 33 is erased, the signal FTOTP="L", and hereafter the signal TTER="H" is attained as shown in FIG. 5. When TTER="H", that is, as far as the state "H" is maintained, the data erasing operation is permitted, so that the nonvolatile memory can be used as the flash memory capable of erasing data. However, when this PAD 42 is shipped to the user after packaging, the PAD 42 is in the open state because it is not connected to the pin of the package. Thus, it is not possible for a final user to conduct an operation for allowing the data erasing operation. That is, the nonvolatile memory device shipped after processed for the one-time PROM can only be used as a one-time PROM.

The erasure prohibiting circuit of the present invention may be provided such that erasure of the entire area of the memory cell array is prohibited, or such that erasure of a part of the memory cell is prohibited by combination with address signals.

In summary, in the nonvolatile memory device of the present invention, prohibition of the internal data and release of the prohibition after executing the prohibition can be implemented by the manufacturer before packaging. However, a primary user or a final user can not release the prohibition if the erasure of the internal data is prohibited. If, in contrast, the erasure of the internal data is permitted at the time of shipment, the primary or final user may execute the prohibiting processing. As a matter of course, the primary user cannot release prohibition of the writing of internal data.

As described before, the nonvolatile memory device of the present invention has the following effects.

1. At the time of shipment after manufacture, or for a primary user, prohibition processing to erase or to rewrite internal data is possible, it is possible to prevent unfair employment of nonvolatile memory devices by dishonest alteration of the internal data used in IC cards, mobile phones, pinball games or game machines.

2. The nonvolatile memory device of the present invention can be selectively set as an electrically erasable flash memory or as a one-time memory device in which one-time writing is permitted, and the manufacturer can respond to the primary user's selection up until just before shipment.

3. Nonvolatile memory devices, which is not appropriate for the electrically erasable flash memory devices due to slow erasure or degraded gate insulating film as determined by the memory cell test can be used as the one-time PROM by executing processing for one-time memory, which improves the yield rate in manufacturing the nonvolatile memory devices.

What is claimed is:

1. A nonvolatile memory device provided with an erasure prohibiting circuit for prohibiting erasure of the content of data in said nonvolatile memory device, wherein said erasure prohibiting circuit permanently prohibits erasure of the data when an instruction to prohibit erasure is directed from the outside of said nonvolatile memory device.

2. A nonvolatile memory device according to claim 1, wherein said erasure prohibiting circuit comprises an erasure prohibiting memory portion for storing either one of first information for prohibiting erasure or second information for permitting erasure.

3. A nonvolatile memory device according to claim 2, wherein said erasure prohibiting circuit comprises in the erasure prohibiting memory portion, an setting erasure circuit for writing said first information, and a setting writing circuit for writing said second information.

4. A nonvolatile memory device according to claim 3 comprising,
an erasure instructing resistor for storing a decoded erasure instruction for instructing erasure of the data content; and
an erasure circuit for erasing the data content in the memory cell array based on the output of said erasure instructing resistor;
wherein, said erasure prohibiting circuit comprises an erasure prohibition control circuit for controlling whether or not the output of said erasure instructing resistor is transmitted to said erasure circuit, and an erasure setting circuit is allowed to be energized, only when an output of said erasure prohibition control circuit outputs an erasure permission.

5. A nonvolatile memory device according to claim 4, wherein said erasure prohibiting circuit is provided with an erasure prohibition release means for forcibly converting the output of said erasure prohibition control circuit to the erasure permission state.

6. A nonvolatile memory device according to claim 5, wherein said erasure prohibition release means is made operable only when the nonvolatile memory device is in the form of a wafer.

7. A nonvolatile memory device according to claim 4, wherein said erasure prohibiting circuit is provided with an erasure prohibition initializing means for forcibly writing first information into said erasure prohibition memory portion.

8. A nonvolatile memory device according to claim 7, wherein said erasure prohibiting initializing means is made operable only when the nonvolatile memory device is in the form of a wafer.

9. A nonvolatile memory device according to claim 3 comprising,
an erasure instructing resistor for storing a decoded erasure instruction; and
an erasure circuit for erasing a data content in a memory cell array based on the output of said erasure instructing resistor;
wherein said erasure prohibiting circuit comprises an erasure prohibition control circuit for controlling whether or not said erasure instructing resistor is reset, and the setting erasure circuit is allowed to be energized only when the erasure prohibition control circuit outputs an erasure permission.

10. A nonvolatile memory device according to claim 1 comprising:
an erasure instructing resistor for storing a decoded erasure instruction for instructing erasure of the data content; and
an erasure circuit for erasing the data content in a memory cell array based on an output of said erasure instructing resistor;
wherein said erasure prohibiting circuit comprises an erasure prohibition control circuit for controlling whether or not an output of said erasure instructing resistor is transmitted to said erasure circuit.

11. A nonvolatile memory device according to claim 1, wherein the nonvolatile memory device comprises:
an erasure instructing resistor for storing a decoded erasure instruction; and
an erasure circuit for erasing the data content in the memory cell array based on an output of said erasure instructing resistor;
wherein, said erasure prohibiting circuit comprises an erasure prohibition control circuit for controlling whether or not said erasure instructing resistor is reset based on a setting state of said erasure prohibition memory portion.

12. A nonvolatile memory device, wherein the electrically writable and erasable nonvolatile semiconductor memory device comprises a memory means that stores the erasure permitted state or the erasure prohibited state, and wherein said memory means is set at the erasure permitted state only when an erasure prohibiting setting means capable of setting either one of the erasure permitted state or the erasure prohibited state, and an erasure prohibition release means for forcibly releasing the erasure prohibited state, and said erasure prohibition release means are in the released state.

13. A nonvolatile semiconductor memory device, wherein in the electrically writable and erasable nonvolatile memory device comprises a memory means that stores the erasure permitted state or the erasure prohibited state, and wherein said electrically erasable memory device comprises:

an erasure prohibition setting means capable of setting the electrically writable and erasable nonvolatile memory devices to either one of the erasure permitted state or the erasure prohibited state based on information stored in said memory means; and an erasure restricting means for setting the memory means at the erasure permitted state when the erasure prohibition setting means is in the erasure prohibited state.

14. A method for manufacturing a nonvolatile memory device comprising the steps of:

forming a plurality of nonvolatile memory chips on a substrate;

inspecting a threshold value of a memory cell in each nonvolatile memory chip;

initializing an erasure prohibition memory portion that is provided in a erasure prohibiting circuit for prohibiting erasure of a data content for storing either one of first information that prohibits erasure or second information that permits erasure;

encapsulating the wafer after separated it into a plurality of nonvolatile memory chips in packages;

writing a predetermined program into said nonvolatile memory chip; and writing erasure prohibition information in said erasure prohibiting memory portion.

* * * * *